United States Patent [19]
Lee

[11] Patent Number: 6,097,042
[45] Date of Patent: Aug. 1, 2000

[54] SYMMETRICAL MULTI-LAYER METAL LOGIC ARRAY EMPLOYING SINGLE GATE CONNECTION PAD REGION TRANSISTORS

[75] Inventor: Il Woo Lee, Kyoungki-do, Rep. of Korea

[73] Assignee: Hyundai Electronics, Industries Co., Ltd., Ichon-shi, Rep. of Korea

[21] Appl. No.: 09/083,950

[22] Filed: May 26, 1998

[30] Foreign Application Priority Data

May 23, 1997 [KR] Rep. of Korea ....................... 97-20471

[51] Int. Cl.⁷ .................................................. H01L 27/10
[52] U.S. Cl. .......................................................... 257/204
[58] Field of Search .................................. 257/202, 204, 257/207

[56] References Cited

U.S. PATENT DOCUMENTS

| | | | |
|---|---|---|---|
| 5,384,472 | 1/1995 | Yin | 257/204 |
| 5,397,906 | 3/1995 | Kumagai | 257/207 |
| 5,420,447 | 5/1995 | Waggoner | 257/206 |

*Primary Examiner*—Brian Dutton
*Attorney, Agent, or Firm*—Jacobson, Price, Holman & Stern, PLLC

[57] ABSTRACT

An integrated circuit gate array structure includes: a semiconductor substrate including a plurality of columns of semiconductor material of a first conductivity type and a plurality of columns of semiconductor material of a second conductivity type; active areas formed within the columns to which can be connected conductive material, thereby forming active regions; gate connection regions, each controlling a flow of current between a source and a drain which are formed in each of the active regions, wherein each gate connection region has single gate connection pad region; and tap regions formed outside the columns, each of the tap regions being associated with one pair of the columns, the tap region being dropped with an opposite material than their respective columns thereby allowing current and voltage characteristics of the columns to be controlled.

5 Claims, 5 Drawing Sheets

SYMMETRICAL MULTI-LAYER METAL LOGIC ARRAY EMPLOYING SINGLE GATE CONNECTION PAD REGION TRANSISTORS

FIELD OF THE INVENTION

The present invention relates to a complementary metal-oxide silicon (CMOS) logic gate array; and, more particularly, to a CMOS logic gate array having a plurality of core cells

DESCRIPTION OF THE PRIOR ART

Gate arrays are used in VLSI integrated circuit chips to implement MOSFET circuits in semiconductor wafers. An MOS gate array consists of an array of MOS transistor sources and drains separated by channels, above which are formed gates to control the conductivity of the channels and thus the state of the transistors. An array of these gates(and their sources and drains) becomes functional only when connected by conductive wiring to appropriate other elements.

Generally, the connecting is accomplished in two steps: a library of macrocells is available to translate simple frequently used logic function such as NAND, flip-flop, AND, multiplier, and counter into a gate array wiring pattern, then the macrocells are connected together to form the complex logic functions of the VLSI chip.

There has been considerable interest in implementing complex logic operations on smaller areas of semiconductor material while simultaneously retaining the flexibility provided by a gate array in which identical structural units or core cells repeat throughout a large portion of the semiconductor area. A gate array structure consists generally of a base array of many active areas which can be fabricated as a standard product on which is formed one or more "personality layers" comprising conductive material to interconnect the active area into a desired logical structure.

The personality layers reflect the function or functions to be implemented by the finished array. A given base array can be used to implement many different functions by appropriately designing the personality layers. Thus, a gate array allows many different logic functions to be implemented using the same base array. The geometry of the basic array cell affects the ability of the designer using later metalization to achieve a final product having maximum density and performance.

One prior art CMOS gate array structure is disclosed in Pat. No. 5,384,427 issued on Jan. 24, 1995 to Patrick Yin as also shown in FIGS. 1 and 2. Referring to FIG. 1, there is shown a final configuration of a symmetric gate array structure. The gate array structure includes strips of substrate taps that run the length of a core cell column. The core cell column includes a p-channel column and an n-channel column. The horizontal length of the conventional symmetric gate array structure is $56.7\mu$ and the vertical length thereof is $20.9\mu$.

Referring to FIG. 2, there is illustrated a core cell 100 contained in the core cell column. The core cell 100 includes two active areas 10 and 20, wherein the active area 10 has two p-type transistors 10A and 10B and the active area 20 contains tow n-type transistors 20A and 20B. Each of the transistors 10A–B and 140A–B include a source region and a drain region, and a gate region for controlling the flow of current therebetween. The gate region has two gate connection pad regions, wherein both are formed both ends of the gate region, respectively. Substrate taps 30A–B are located adjacent to their associated transistor pair.

The substrate taps 30A–B are not an integral part of the routing area of the core cell. Since the taps 30A–B are outside of the routing area, the power line, which connects the substrate taps as well as the source region of the transistors, runs on the top the substrate taps.

Although the above conventional symmetrical multi-layer logic array with continuous substrate taps provides a more symmetric design that increases cell density, it is still needed for the CMOS gate array structure to have a more increased cell density in order to implement various logic operations on smaller area of the semiconductor.

SUMMARY OF THE INVENTION

It is, therefore, an object of the invention to provide an intergrated circuit gate array structure which is capable of effectively providing a more increased cell density.

In accordance with the present invention, there is provided an integrated circuit gate array structure comprising: a semiconductor substrate including a plurality of columns of semiconductor material of a first conductivity type and a plurality of columns of semiconductor material of a second conductivity type; active areas formed within the columns to which can be connected conductive material, thereby forming active regions; gate connection regions, each controlling a flow of current between a source and a drain which are formed in each of the active regions, wherein each gate connection region has single gate connection pad region; and tap regions formed outside the columns, each of the tap regions being associated with one pair of the columns, the tap region being dropped with an opposite material than their respective columns thereby allowing current and voltage characteristics of the columns to be controlled.

BRIEF DESCRIPTION OF THE DRAWINGS

The above and parent from the following description of preferred embodiments given in conjunction with the accompanying drawings, in which.

DETAILED DESCRIPTION OF THE PREFERRED EMBODIMENTS

Figure 3:
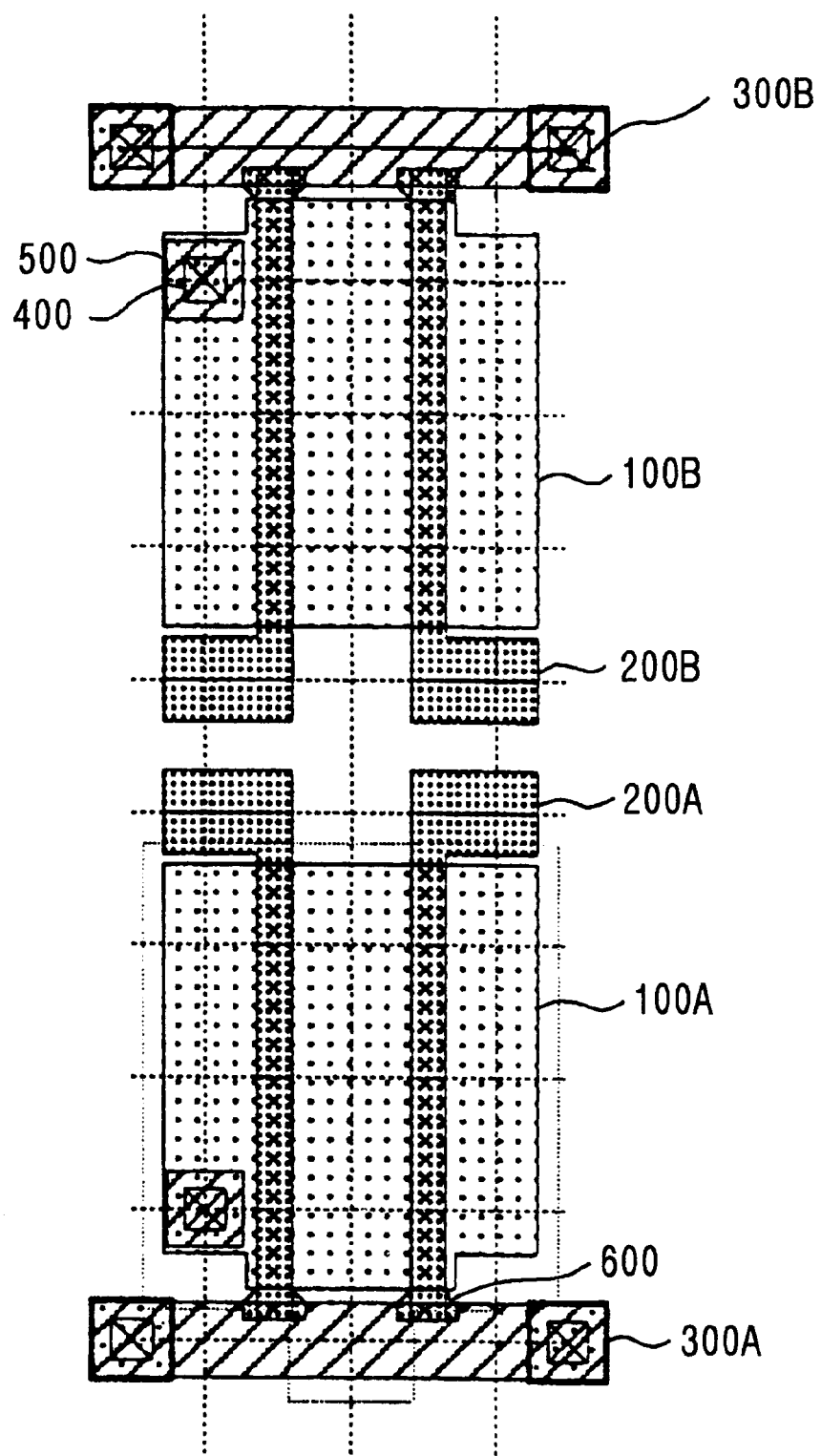
FIG. 3 describes a diagram of a core cell used in a gate array structure in accordance with the present invention.

Referring to FIG. 3, there is shown a gate array core cell employed in a gate array structure in accordance with the present invention. As shown, the gate array core cell includes two active regions 100A and 100B, wherein the active area 100A has two n-type transistors and the active area contains two p-type transistors. Each of the transistors includes a source region and a drain region, and a gate region for controlling the flow of current therebetween. The gate region includes single gate contact pad region 200A–B located at an end of the gate region.

Substrate taps 300A–2 are located adjacent to their associated active region 100A–B. That is, the substrate tap region 300A is located adjacent to the active region 100A to control a bias direction between a p-well and a substrate. The substrate tap region 300B is located adjacent to the active region 100B in order to control a bias direction between an n-well and the substrate. Each of the substrate taps includes a contact point and a metal layer formed thereon in order to obtain a good operational characteristic of the core cell.

For the sake of convenience, although a contact point 400 has been described in FIG. 3, there can be a plurality of contact points in each of the active region. The contact point 400 can be arbitrary located in the active region 100A–B in order to form a base cell such as inverter, NAND, NOR and the like. In accordance with the present invention, a metal layer 500 is provided on the contact point 400 in order to secure the operation of the base cell.

A poly end cap 600 is provided to the end of the gate region instead of a gate contact pad region or between substrate taps and the gate region, while the other end thereof is provided with the gate contact pad region 200A. In order to obtain a desired function, both side walls of the poly end cap 600 preferably has an angle of 45°.

Figure 4:
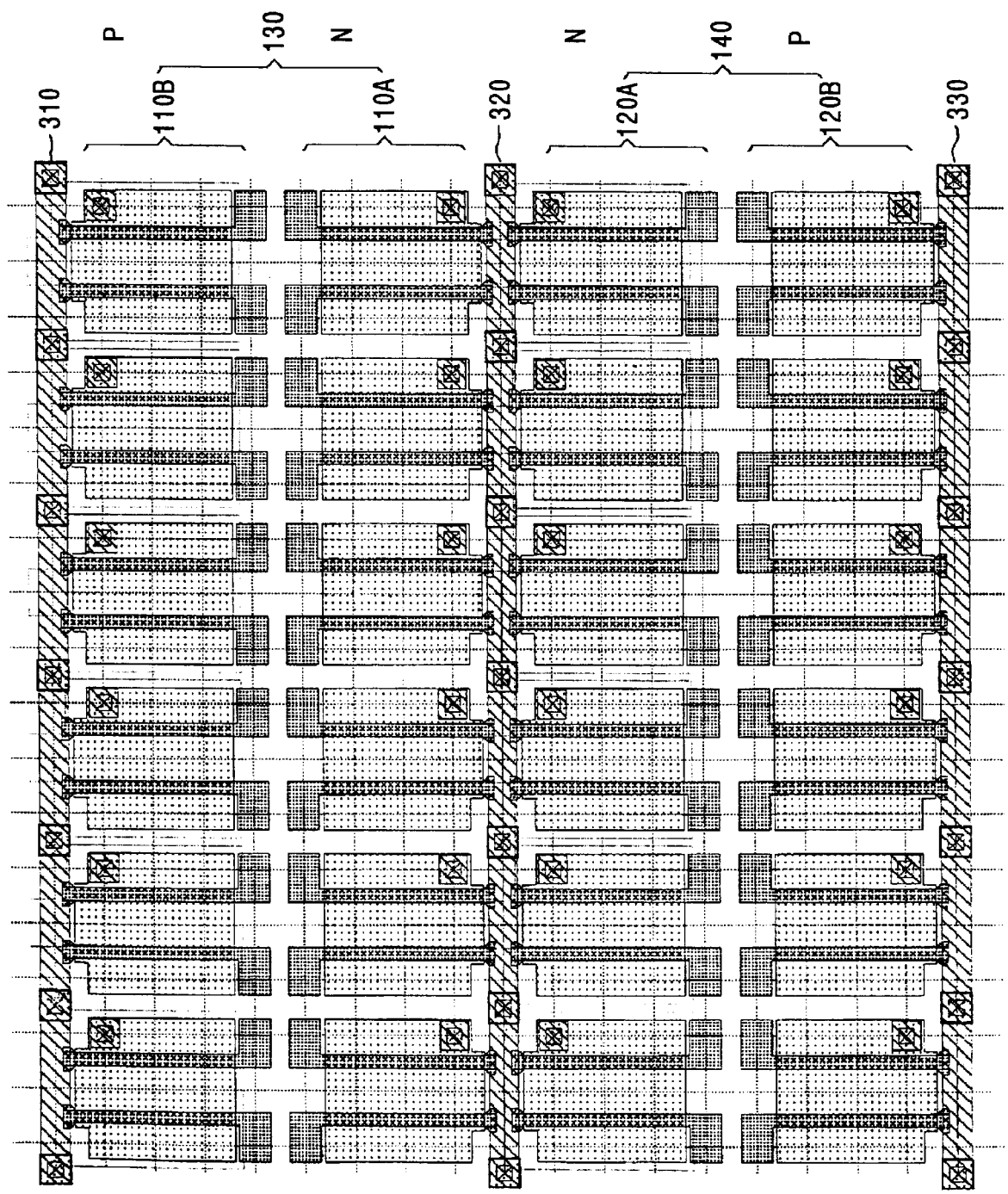
FIG. 4 illustrates a diagram of the gate array structure employing the core cell shown in FIG. 3.

Referring now to FIG. 4, shown is a gate array structure that utilizes the core cell shown in FIG. 3. As shown, the gate array structure includes a first n-channel column 110A and a strip of substrate taps 320 that runs the length of the n-channel column 110A. Since the strip of the substrate taps 320 run the length of the n-channel column 302, the taps 320 have good electrical characteristics. On the other side of the n-channel column 110A is a p-channel column 110B. Adjacent to the p-channel column is another strip of substrate taps 310 that runs the length of the p-channel column 110B. The n-channel and the p-channel columns 110A and 110B comprise a first transistor column pair 130 having single gate contact pad region.

An n-channel column 120A is adjacent to the strip of substrate taps 320 and a p-channel column 120B is adjacent to the n-channel column 120A. Another strip of substrate taps 330 is adjacent to the p-channel column 120B, which runs the length of the p-channel column 120B. The n-channel and p-channel columns 120A and 120B comprise a second transistor column pair 140 having single gate contact pad region. Each pair of n-channel and p-channel columns is mirrored with the adjacent of n-channel and p-channel column pair.

As can be seen from the above, each of the active regions contained in each column has single gate contact pad region to thereby effectively provide a more increased cell density. Furthermore, instead of the other gate contact pad region, the poly end cap is provided at one end of gate region in order to obtain a good gate operational characteristic of the transistor. Further, the metal layer formed over the contact point is capable of providing a good operational characteristic to the base cell.

Figure 1:
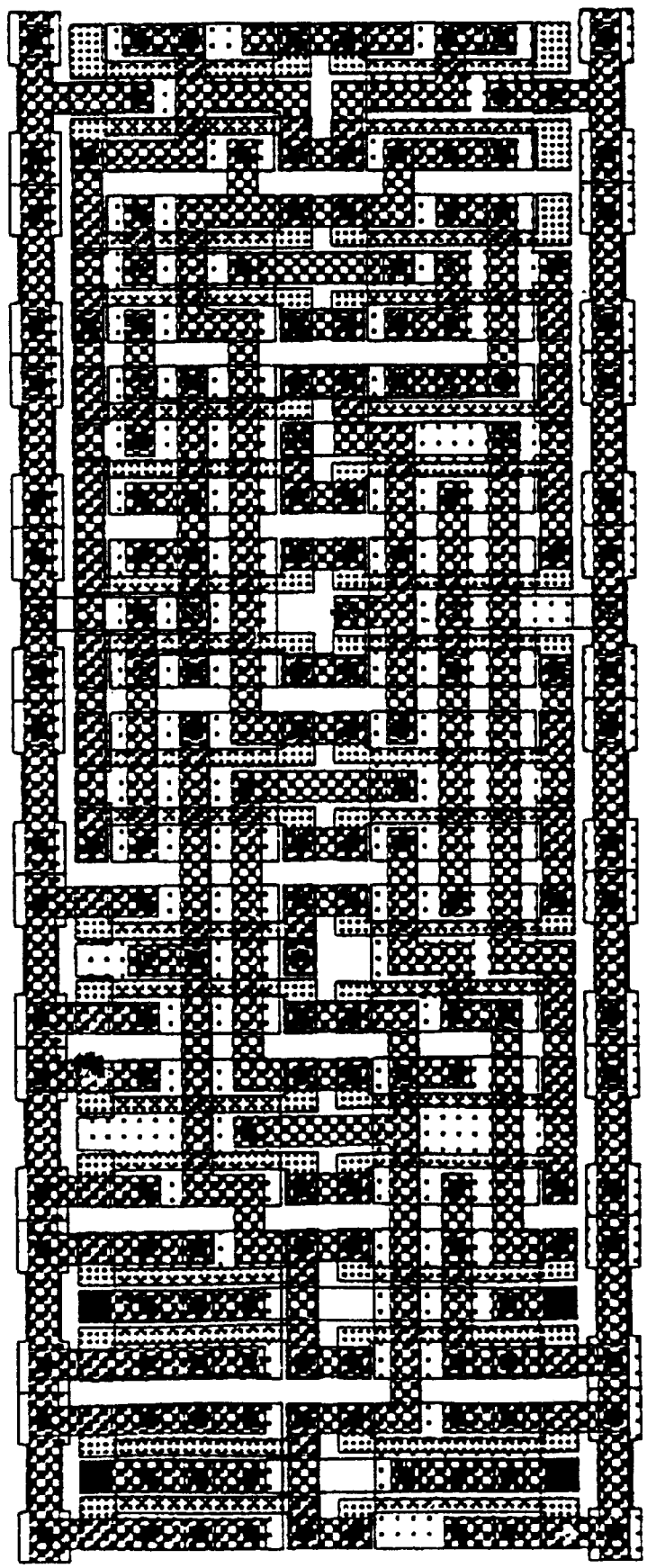
FIG. 1 shows a diagram of a final configuration of a conventional gate array structure.
Figure 2:
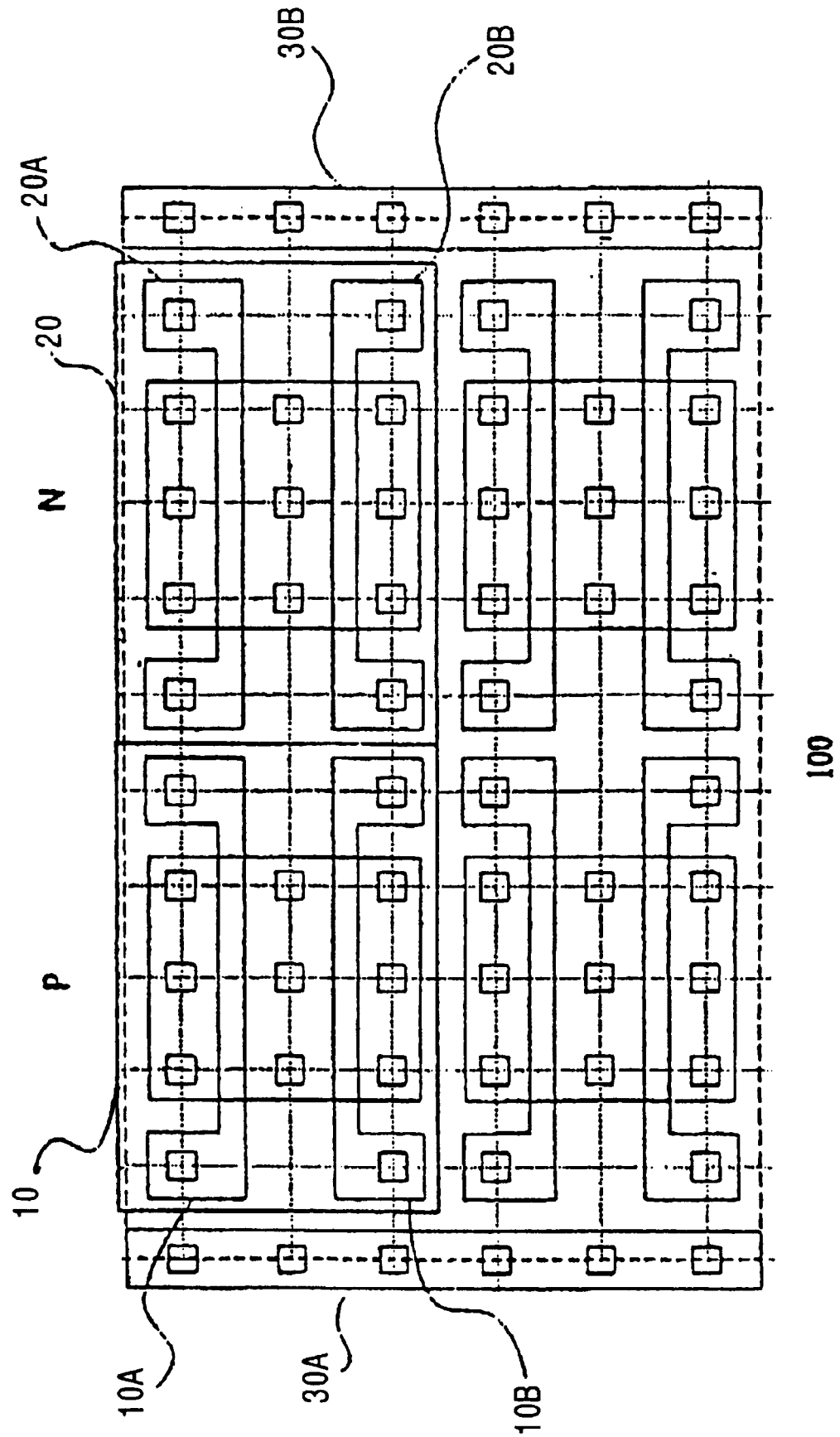
FIG. 2 discloses a detailed diagram of a core cell employed in the conventional gate array structure shown in FIG. 1.
Figure 5:
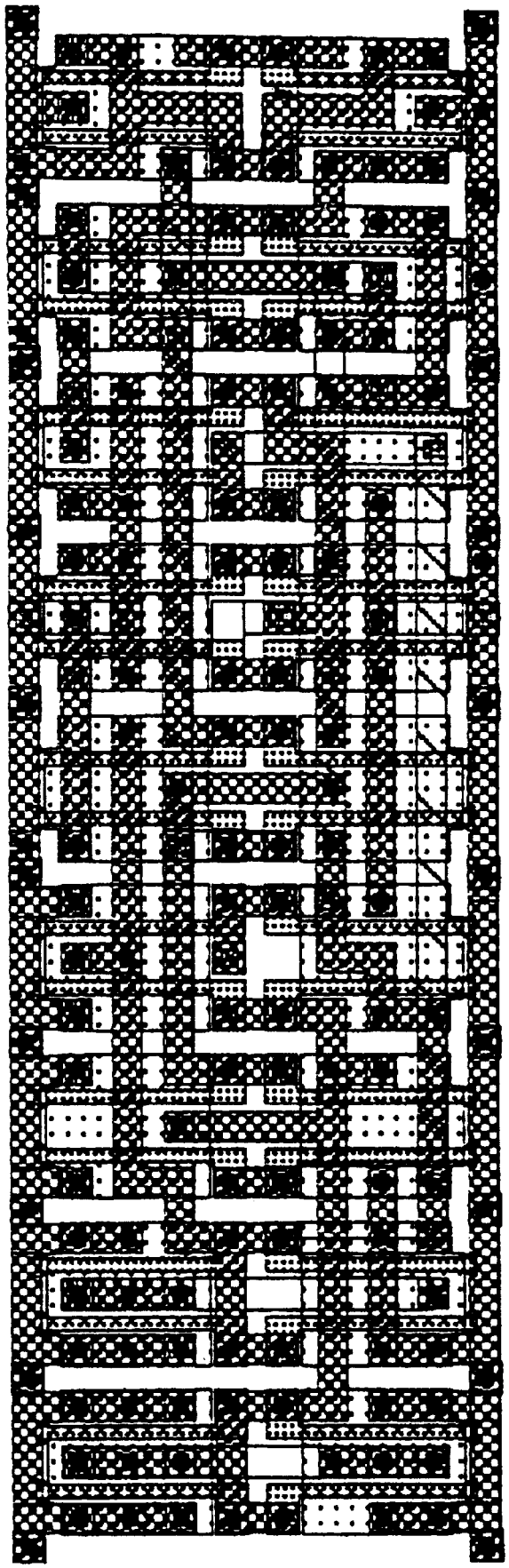
FIG. 5 provides a diagram of a final configuration of the gate array structure shown in FIG. 4.

Referring now to FIG. 5, there is shown a final configuration of the gate array structure in accordance with the present invention. The horizontal length of the conventional symmetric gate array structure is $56.7\mu$ and the vertical length thereof is $17.1\mu$. Comparing the gate array structure shown in FIG. 5 to the conventional gate array depicted in FIG. 1, it is readily appreciated that the gate array structure of the present invention can provide a more increased cell density in an effective manner.

While the present invention has been shown and described with reference to the particular embodiments, it will be apparent to those skilled in the art that many changes and modifications may be made without departing from the spirit and scope of the invention as defined in the appended claims.

What is claimed is:

1. An integrated circuit gate array structure comprising:
   a semiconductor substrate including a plurality of first columns of semiconductor material of a first conductivity type and a plurality of second columns of semiconductor material of a second conductivity type;
   first active regions formed within the columns, which includes contacts to which conductive material can be connected;
   second active regions formed within the columns, which includes contacts to which conductive material can be connected;
   gate connection regions, each controlling a flow of current between a source and a drain which are formed in each of the active regions, wherein each gate connection region of said gate connection regions has a single gate connection pad region; and
   tap regions formed outside of the columns, each of the tap regions being associated with one pair of the columns, the tap regions being doped with an opposite conductivity type than columns which are adjacent to the tap regions thereby allowing current and voltage characteristics of the columns to be controlled, wherein the single gate connection pad region is formed at one end of the each gate connection region and the each gate connection region includes a poly end cap formed between the other end of the each gate connection region and each of the tap regions.

2. The integrated circuit gate array structure as recited in claim 1, each of the active regions includes a plurality of contact points, each contact point having a contact and a metal layer.

3. The integrated circuit gate array structure as recited in claim 1, wherein both side walls of the poly end cap has an angle of 45°.

4. The integrated circuit gate array structure as recited in claim 3, wherein a core cell of the gate array structure comprises;
   a first pair of transistors within an active region of the first active regions formed within the first columns;
   a second pair of transistors within an active region of the second active regions formed within the second columns; and
   a substrate tap within one of the tap regions located adjacent to one of the first and second pair of transistors.

5. The gate array structure as recited in claim 4, wherein the tap regions comprises strips of substrate taps that run the length of the column pairs.

* * * * *